US007390571B2

(12) United States Patent
Hirai et al.

(10) Patent No.: US 7,390,571 B2
(45) Date of Patent: Jun. 24, 2008

(54) VARNISH FOR LAMINATE OR PREPREG, LAMINATE OR PREPREG PREPARED USING THIS VARNISH, AND PRINTED WIRING BOARD PREPARED USING THIS LAMINATE OR PREPREG

(75) Inventors: Yasuyuki Hirai, Oyama (JP); Norihiro Abe, Shimodate (JP); Yoshiyuki Takeda, Shimodate (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 0 days.

(21) Appl. No.: 11/362,011

(22) Filed: Feb. 27, 2006

(65) Prior Publication Data

US 2006/0141262 A1 Jun. 29, 2006

Related U.S. Application Data

(63) Continuation of application No. 10/450,176, filed as application No. PCT/JP01/10884 on Dec. 12, 2001, now Pat. No. 7,041,399.

(30) Foreign Application Priority Data

Dec. 14, 2000 (JP) ............................. 2000-380174
Dec. 14, 2000 (JP) ............................. 2000-380175

(51) Int. Cl.
  *B32B 27/38* (2006.01)
  *B32B 27/04* (2006.01)
  *B32B 27/18* (2006.01)
  *B32B 15/092* (2006.01)
  *C08L 63/00* (2006.01)

(52) U.S. Cl. .................... 428/416; 428/297.4; 428/413; 428/414; 428/415; 428/417; 428/418; 428/901; 523/400; 523/457; 523/461; 523/466

(58) Field of Classification Search ................ 523/400, 523/456, 457, 461, 466; 528/93, 94, 103, 528/106, 119, 121; 428/413, 414, 415, 416, 428/417, 418, 901, 375, 396, 297.4
See application file for complete search history.

(56) References Cited

U.S. PATENT DOCUMENTS

| 4,923,910 | A | 5/1990 | Kitagawa et al. | |
| 5,837,355 | A | 11/1998 | Hayai | |
| 5,994,429 | A | 11/1999 | Honda et al. | |
| 6,720,077 | B2 * | 4/2004 | Hirai et al. | 428/416 |
| 7,041,399 | B2 * | 5/2006 | Hirai et al. | 428/545 |

FOREIGN PATENT DOCUMENTS

| EP | 0 472 830 | 4/1992 |
| JP | 59-038235 | 2/1984 |
| JP | 06-100763 | 4/1994 |
| JP | 06-100764 | 4/1994 |
| JP | 08-003283 | 9/1996 |
| JP | 09-263647 | 7/1997 |
| JP | 2000-136292 | 5/2000 |

OTHER PUBLICATIONS

Supplementary European Search Report, for Application No. 01270570.3-2102 PCT/JP01/10884, dated Sep. 5, 2005.
International Search Report for No. PCT/JP01/10884, mailed Mar. 12, 2002.

* cited by examiner

*Primary Examiner*—Michael J Feely
(74) *Attorney, Agent, or Firm*—Antonelli, Terry, Stout & Kraus, LLP.

(57) ABSTRACT

Disclosed are a varnish for laminate or prepreg, comprising a heat treatment product which is obtained by mixing together (a) an epoxy resin, (b) dicyandiamide, and (c) a compound having an imidazole ring so that the component (c) is present in an amount of 0.001 to 0.03% by weight, based on the weight of the component (a), and subjecting the resultant mixture to reaction for heat treatment in an organic solvent at a temperature of 70° C. to less than 140° C. so that all of the components are compatible with one another in the absence of a solvent; and (d) inorganic filler, a laminate or prepreg prepared using the varnish and a printed wiring board prepared using the laminate and/or prepreg.

23 Claims, No Drawings

VARNISH FOR LAMINATE OR PREPREG, LAMINATE OR PREPREG PREPARED USING THIS VARNISH, AND PRINTED WIRING BOARD PREPARED USING THIS LAMINATE OR PREPREG

This application is a Continuation application of application Ser. No. 10/450,176, filed Jun. 12, 2003, now U.S. Pat. No. 7,041,399 the contents of which are incorporated herein by reference in their entirety. No. 10/450,176 is a National Stage application, filed under 35 USC 371, of International (PCT) Application No. PCT/JP01/10884, filed Dec. 12, 2001.

TECHNICAL FIELD

The present invention relates to a varnish for flame-retardant laminate or prepreg for electrical insulation, a flame-retardant laminate or prepreg for electrical insulation obtained by using the varnish, and a printed wiring board using these materials.

BACKGROUND ART

In recent years, there are demands for laminates (which, in the present invention, include a laminate covered with a metal foil on the top or the top and bottom, namely, a metal-clad laminate) and prepregs for electrical insulation, in which they should have a high stiffness and a high dielectric constant or contrary a low dielectric constant, and be free of halogens, and the laminates and prepregs tend to contain various inorganic fillers in a large amount for meeting such demands. Especially the production of halogen-free laminates or prepregs is carried out for avoiding a so-called dioxin problem that arises when burning materials containing halogenated compounds, and a large amount of an inorganic oxide or hydroxide is frequently added to impart flame retardancy to a laminate or prepreg without using a halogenated flame retardant.

However, when a large amount of inorganic filler is added to the resin system which has conventionally and generally been used, in which an epoxy resin is cured by dicyandiamide, separation between the resin and the filler may occur during lamination, resulting in a non-uniform laminate. This is a characteristic phenomenon of the dicyandiamide curing, which phenomenon is barely observed in other resin systems such that an epoxy resin is cured by other curing agents (a novolak resin, etc.), and this phenomenon is remarkable especially when an epoxy resin having a phenolic novolak skeleton or a cresol novolak skeleton is used in a large amount. Such a non-uniform laminate has not only a problem about appearance but also a problem in that various properties of the laminate are degraded, especially the resistance to soldering heat is markedly reduced. There is an epoxy resin which does not cause the above-mentioned separation between the resin and the filler, but, for obtaining excellent heat resistance and high reliability required for the applications of laminate for electrical insulation and printed wiring board without using halogen elements, it is necessary to use an epoxy resin having a stiff structure, such as a phenolic novolak skeleton. For solving these problems, Japanese Unexamined Patent Publication No. 60951/1999 discloses a method in which the surface of inorganic filler is treated with a silicone oligomer to enhance the adhesion between the resin and the filler, whereby improving the dispersion property of the resultant mixture. However, such a surface treatment for the filler causes the production cost to rise, and is therefore difficult to apply to general-purpose laminates and prepregs.

DISCLOSURE OF THE INVENTION

The present inventors have made intensive studies as to what action causes the separation between the resin and the inorganic filler, and, as a result, they have found that this problem is attributed to the compatibility between the resin and dicyandiamide. That is, dicyandiamide is poorly compatible with most of the epoxy resins, especially epoxy resins having a phenolic novolak skeleton or a cresol novolak skeleton, and therefore precipitates in the epoxy resin after the solvent volatilizes. Therefore, it is considered that the curing reaction in the prepreg becomes very non-uniform and this non-uniformity causes the inorganic filler to be separated from the resin.

Japanese Unexamined Patent Publication No. 3283/1996, U.S. Pat. No. 5,143,756, EP 0 472 830, and Japanese Unexamined Patent Publication No. 140352/1993 disclose a method in which an epoxy resin and dicyandiamide are preliminarily reacted so that they are compatible with each other. However, this method is intended to make the laminate properties uniform, and, in the above prior art documents, an effect obtained when inorganic filler is used in a large amount is not referred to at all. Thus, the above method does not satisfy the demand for the current situation in which the technique for improving the function of laminate or prepreg using filler is becoming common. Further, when a general epoxy resin composition of dicyandiamide-curing type is merely subjected to preliminary reaction, a problem about the storage stability of the resultant prepreg arises. For example, Japanese Unexamined Patent Publication No. 263647/1997 discloses that it is desired that dicyandiamide is present in a dispersed state in the epoxy resin as it is incompatible with the epoxy resin, from the viewpoint of obtaining excellent storage stability. That is, the varnish for a laminate or a prepreg using an epoxy resin and dicyandiamide needs to achieve both excellent compatibility in which separation of the inorganic filler from the resin does not occur, and excellent storage stability.

An object of the present invention is to provide a varnish for a laminate or a prepreg in which storage stability of the varnish is excellent and separation between a resin and inorganic filler does not occur, a flame-retardant laminate or prepreg for electrical insulation using the varnish in which it is uniform and prevented from occurrence of blister and has excellent heat resistance and high reliability, and further a printed wiring board using the laminate or the prepreg.

The present invention is solved the above-mentioned problems and an inorganic filler is introduced into an epoxy resin laminate cured by dicyandiamide with a large amount, which is uniformly dispersed therein.

That is, the present invention is a varnish for a laminate or a prepreg, which comprises: a heat treatment product which is obtained by mixing together (a) an epoxy resin, (b) dicyandiamide, and (c) a compound having an imidazole ring so that the component (c) is present in an amount of 0.001 to 0.03% by weight, based on the weight of the component (a), and subjecting the resultant mixture to reaction for heat treatment in an organic solvent at a temperature of 70° C. to less than 140° C. so that all of the components are compatible with one another in the absence of a solvent, and (d) inorganic filler; and a laminate and a prepreg obtained from the varnish as well as a printed wiring board constituted by using the laminate or prepreg.

BEST MODE FOR CARRYING OUT THE INVENTION

As the component (a) contained in the varnish for laminate or prepreg to be used in the present invention, an epoxy resin having a structure represented by the following formula (1):

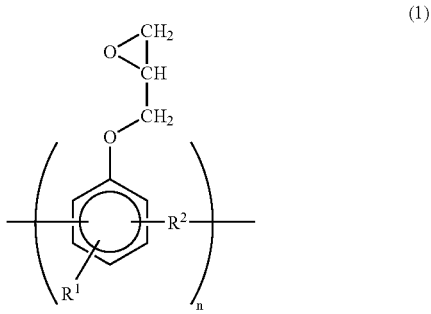

(1)

wherein each of $R^1$ represents a hydrogen atom or an optional monovalent organic group, $R^2$ represents an optional divalent organic group, and n is an integer of 2 or more, is desired, and two or more types of the above epoxy resins can be used in an appropriate combination.

In the formula (1), as the monovalent organic group of $R^1$, there may be mentioned, for example, a straight or branched alkyl group having 1 to 12 carbon atoms, an alkenyl group having 2 to 5 carbon atoms and the like. $R^1$ is preferably a hydrogen atom or an organic group selected from a methyl group, an octyl group, a nonyl group, a decyl group, a dodecyl group, a t-butyl group, and a vinyl group, more preferably a hydrogen atom or a methyl group. Also, as the divalent organic group of $R^2$, there may be mentioned, for example, a substituted or unsubstituted straight or branched alkylene group having 1 to 12 carbon atoms, a substituted or unsubstituted alkenylene group having 2 to 5 carbon atoms, a substituted or unsubstituted arylene group having 6 to 12 carbon atoms and the like. $R^2$ is preferably a divalent organic group selected from a methylene group, an ethylene group, a dimethyldicyclopentadienylene group, and a 4,5-dimethyl-1,2-xylylene group, more preferably a methylene group. Particularly when a phenolic novolak epoxy resin produced by epoxidizing the hydroxyl groups of a phenolic resin is used as the component (a), the effect of the present invention is remarkably exhibited. Specifically, preferred examples include a phenolic novolak epoxy resin, an ortho-cresol novolak epoxy resin, a dicyclopentadiene-modified phenolic novolak epoxy resin, a phenolated polybutadiene epoxy resin, a para-vinylphenolic novolak epoxy resin, and a xylene-modified phenolic novolak epoxy resin. Of these, from the viewpoint of reducing a cost and an amount of the resin supplied, a phenolic novolak epoxy resin and an ortho-cresol novolak epoxy resin are most preferred. Also, n is an integer of 2 or more, preferably an integer of 2 to 6.

Dicyandiamide of the component (b) is a compound represented by the chemical formula of $H_2NC(=NH)NHC\equiv N$ and a commercially available compound can be used.

Also, as the component (c), imidazole, 2- and/or 4- and/or 5-substituted imidazoles, and N-substituted imidazoles can be used, and specifically, there can be used imidazole, 2-methylimidazole, 2-ethylimidazole, 2-propylimidazole, 2-butylimidazole, 2-phenylimidazole, 4-methyl-imidazole, 2,4-dimethylimidazole, 2-ethyl-4-methylimidazole, 2-butyl-4-methylimidazole, 2-phenyl-4-methylimidazole, benzimidazole, 1,2-dimethylimidazole, 1-methyl-2-ethylimidazole, 1-benzyl-2-methylimidazole, 1-benzyl-2-phenylimidazole, a reaction product of imidazole and a glycidyl compound, a reaction product of imidazole and a diglycidyl compound, and a reaction product of 2-ethyl-4-methylimidazole and a diglycidyl compound. Particularly, preferred are masked imidazoles which have excellent storage stability at normal temperature and immediately promote a reaction upon heating, and especially preferred is a compound represented by the formula (2):

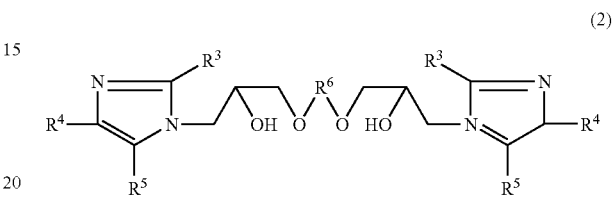

(2)

wherein each of $R^3$, $R^4$ and $R^5$ represents a hydrogen atom, a methyl group, an ethyl group or a phenyl group, and $R^6$ is an optional divalent organic group.

In the formula (2), as the divalent organic group of $R^6$, there may be mentioned, for example, a substituted or unsubstituted straight or branched alkylene group having 1 to 12 carbon atoms, a substituted or unsubstituted arylene group having 6 to 20 carbon atoms and the like. As the substituent, there may be mentioned, for example, an alkyl group, an aryl group and the like. It is preferably mentioned, for example, a 1,4-phenylene group, a 4,4'-biphenylene group, a 3,3',5,5'-tetramethyl-4,4'-biphenylene group, a 4,4'-diphenylenemethane group, a 2,4'-diphenylenemethane group, a 2,2'-diphenylenemethane group, a 2,2-bis(4-phenylene)propane group, etc., more preferably a 2,2-bis(4-phenylene)propane group.

The component (c) promotes the curing of the epoxy resin according to the amount thereof added, and is generally used in an amount of 0.1 to 1.0% by weight, based on the weight of the epoxy resin. However, in the present invention, it is necessary that the amount of the component (c) be 0.001 to 0.03% by weight, based on the weight of the component (a). The reason for the use of the component (c) in such a small amount is that a reaction for enhancing the compatibility between the epoxy resin and dicyandiamide causes the curing of the resin to be fast, and the above-mentioned amount of the component (c) is far smaller than the appropriate amount of a curing promoter added for a general resin composition comprising an epoxy resin and dicyandiamide. Further, there is strong correlation between the amount of the component (c) added and the storage stability of the varnish for a laminate or a prepreg, or the prepreg, and, from the viewpoint of obtaining excellent storage stability, the component (c) in the present invention, which secures a satisfactory curing property in a small amount, is very effective. That is, when the amount of the component (c) added is larger than the upper limit of the above range, the gel time of the varnish after the reaction for enhancing the compatibility becomes too short and the storage stability of the varnish or prepreg becomes poor. On the other hand, when the amount is smaller than the lower limit of the above range, the curing property of the prepreg becomes poor, causing the properties of the resultant laminate to be degraded.

As the component (d), almost all commercially available inorganic fillers for industry can be used. In general, a laminate is produced by a method in which paper or a glass fiber base material is impregnated with a varnish which is obtained by dissolving a resin in an organic solvent to prepare coated paper or coated cloth, and the prepared paper or cloth is subjected to laminating press to produce a laminate. Therefore, the component (d) needs to be uniformly dispersible in the varnish, to be difficult to sediment or separate in the varnish, and not to greatly affect the varnish viscosity. Specifically, there can be used one type of or a mixture of two or more types of inorganic fillers selected from aluminum hydroxide, magnesium hydroxide, silica, mica, talc, aluminum oxide, magnesium carbonate, barium carbonate, calcium carbonate, titanium oxide, etc. Especially when using aluminum hydroxide and magnesium hydroxide which are frequently used in a large amount as a flame retardant, the present invention exhibits a remarkable effect.

The reaction between the epoxy resin of the component (a) and dicyandiamide of the component (b) is mainly a ring-opening addition reaction of the epoxy group with the amino group and imino group of the dicyandiamide, and it is known that dicyandiamide undergoes a complicated reaction mechanism in addition to the above reaction, but complete elucidation of the structure of the resultant reaction product has not yet been made. It is presumed that this reaction product has both the structure resulting from ring opening of an epoxy ring and the cyano group and imino group derived from dicyandiamide, and thus, the reaction product is considered to be compatible with both the epoxy resin and dicyandiamide and serve as an agent for enhancing the compatibility between these compounds. Then, although elucidation of the mechanism of the action has not yet been completed, it has been found that the reaction for enhancing the compatibility consequently dramatically improves the dispersion property of the inorganic filler in the resin and solves the problem of separation of the filler from the resin. That is, by reacting the epoxy resin of the component (a), dicyandiamide of the component (b), in the presence of the component (c) in an appropriate organic solvent, the flowability unevenness due to the separation of inorganic filler which has been observed in the prepared laminate is markedly improved, thus improving various properties of the laminate. It is preferred that the reaction for enhancing the compatibility is conducted at 70° C. to less than 140° C., and especially at 80° C. to less than 120° C., the reaction proceeds most efficiently. As the organic solvent to be used, an appropriate solvent which dissolves all three components (a), (b), and (c) can be used. As such an organic solvent, there may be specifically mentioned methyl ethyl ketone, methyl isobutyl ketone, ethylene glycol, diethylene glycol, 2-methoxyethanol, 2-(2-methoxyethyl)ethanol, 2-ethoxyethanol, 2-(2-ethoxyethyl)-ethanol, N,N-dimethylformamide, N,N-dimethylacetamide, N-methyl-2-pyrrolidone, cyclohexanone, etc., and a mixture of two or more organic solvents selected from the above solvents may be used. The behavior of the reaction for enhancing the compatibility between the epoxy resin and dicyandiamide varies depending on the formulation ratio thereof, but, from the viewpoint of obtaining a good balance between the rate of the reaction for enhancing the compatibility and the properties of the cured product, it is preferred that the weight ratio of the dicyandiamide of the component (b) to the epoxy equivalent of the component (a) is in terms of weight (g) of (b)/(weight (g) of (a)/epoxy equivalent)=7.35 to 11.55. When this value is larger than 11.55, a very long time is required for the reaction for enhancing the compatibility, and, when the value is smaller than 7.35, the crosslinking density of the cured product is lowered, whereby causing the stiffness and heat resistance of the resultant laminate to be reduced.

In the varnish, laminate, prepreg, and printed wiring board prepared using these of the present invention, in addition to four components (a), (b), (c), and (d), a flame retardant, a pigment, an adhesive auxiliary, an antioxidant, and a curing promoter can be added. Further, the present invention is especially advantageously applied to a halogen-free varnish, laminate, prepreg, and printed wiring board prepared using these. For securing flame retardancy without using a halogenated compound, a large amount of inorganic flame retardant is required to be added, and this can be easily achieved by the present invention. The term "halogen-free" used here means the varnish, laminate, prepreg, and printed wiring board wherein the components (a), (b), (c), and (d) and other components added do not contain chlorine and/or bromine in respective amounts of 0.1% by weight or more, based on the total weight of the varnish, the laminate, the prepreg, or the wiring board.

Using the varnish for a laminate or a prepreg of the present invention, a prepreg and a laminate can be prepared by the same production method as that for general laminates for electrical insulation, and a printed wiring board using the laminate or prepreg can be prepared. That is, glass cloth, glass nonwoven fabric, or organic fiber cloth is impregnated with the varnish of the present invention, and dried by heating so that the solvent is volatilized and the curing reaction of the epoxy resin slightly proceeded to prepare a prepreg having a desired curing property and desired flowability. Also, a plurality of the prepared prepregs are stacked on one another, and covered with metal foil on the top and bottom, and then disposed between flat heat-transfer plates, and subjected to heat-press by means of a machine which can keep the stacked prepregs at a temperature such that the curing reaction of the epoxy resin proceeds satisfactorily, i.e., at 150° C. or higher, preferably 170° C. or higher, thus preparing a metal-clad laminated board. Further, the metal foil on the metal-clad laminated board is processed into a circuit by a process, such as an etching process, and then subjected to perforation, plating, and resist ink printing to prepare a printed wiring board.

EXAMPLES

In the following, the present invention will be described in more detail with reference to Examples and Comparative examples, which should not be construed as limiting the scope of the present invention.

In Examples and Comparative examples, the epoxy resins, curing promoters and organic flame retardants described below were used. With respect to the additive, inorganic filler, glass cloth, copper foil, etc., which constitute the laminate and prepreg, raw materials generally used in the field of chemical industry and electronics industry were used unless otherwise specified.

Epoxy resin A: Ortho-cresol novolak-type epoxy resin, N-673, trade name (epoxy equivalent: 210), manufactured by Dainippon Ink & Chemicals Incorporated Epoxy resin B: Phenolic novolak-type epoxy resin, DEN438, trade name (epoxy equivalent: 178), manufactured by DOW PLASTICS, U.S.A.

Curing promoter A: Reaction product of bisphenol-A-type epoxy resin (Epikote 828, trade name, manufactured by Japan Epoxy Resins Co., Ltd.) and 2-ethylimidazole (2EZ, trade name, manufactured by Shikoku Chemicals Corporation)

Curing promoter B: 2-Ethyl-4-methylimidazole, 2E4MZ, trade name, manufactured by Shikoku Chemicals Corporation Organic flame retardant A: Triphenylphosphate, TPP, trade name, manufactured by Daihachi Chemical Industry Co., Ltd.

Organic flame retardant B: Tricresylphosphate, TCP, trade name, manufactured by Daihachi Chemical Industry Co., Ltd.

The properties of a laminate were evaluated as follows. The flame retardancy was evaluated in accordance with the Vertical Burning Method described in UL-Subject 94, in terms of burning time, and rating V-0 indicates that the average burning time was 5 seconds or less and the maximum burning time was 10 seconds or less, rating V-1 indicates that the average burning time was 25 seconds or less and the maximum burning time was 30 seconds or less, and rating HB indicates that the average burning time and the maximum burning time were longer than those in the above rating V-1. The resistance to soldering heat was evaluated as follows. Test specimens (25 mm×25 mm, both surfaces copper-clad) were individually placed in solder baths respectively heated at 260° C. and 288° C., and an occurrence of blistering was visually observed in 300 seconds. The symbols shown in Table 1 indicate that: ○: No changing; X: Blistering.

Example 1

A varnish for halogen-free laminate and prepreg was prepared in accordance with the formulation shown below. First, an epoxy resin A, dicyandiamide, a curing promoter A, and 2-methoxyethanol were mixed together, and most of the dicyandiamide was dissolved at room temperature, and then, heated to 100° C. and reacted for 2 hours to obtain a yellow viscous uniform solution. Thereafter, the solution was cooled to 30° C. and other ingredients were added thereto to prepare a varnish. A glass cloth (weight: 105 g/m$^2$) was impregnated with the prepared varnish, and dried at 160° C. for 4 minutes to obtain a prepreg. The eight prepregs were stacked on one another, and disposed between one-side roughened electrolytic copper foils each having a thickness of 18 μm, followed by heat pressure molding at 185° C. at a pressure of 4 MPa for 60 minutes, thus preparing a double-sided copper-clad laminate having a thickness of 0.8 mm.

The rate of the change between the gel time of the varnish immediately after the preparation and the gel time of the varnish after storage at 25° C. for 2 weeks and the properties of the laminate were evaluated, and the results are shown in Table 1.

| Raw materials | Part(s) by weight |
| --- | --- |
| Epoxy resin A | 100 |
| Dicyandiamide | 4.5 |
| Curing promoter A | 0.006 |
| Organic flame retardant A | 15 |
| Aluminum hydroxide | 65 |
| 2-Methoxyethanol | 55 |
| Methyl ethyl ketone | 45 |

Examples 2 to 5

Varnishes for laminate and prepreg were prepared, and then prepregs and laminates were prepared in the same manner as in Example 1. The formulations, the rates of the change in gel time, and the properties of the laminates are shown in Table 1.

Comparative Example 1

A varnish for laminate and prepreg was prepared, and then, a prepreg and a laminate were prepared in the same manner as in Example 1. All the mixing was conducted at room temperature. A glass cloth (weight: 105 g/m$^2$) was impregnated with the prepared varnish and dried at 160° C. for 4 minutes in the same manner as in Example 1 to obtain a prepreg. However, white dicyandiamide crystals were precipitated on the entire surface of the prepreg. The eight prepregs were stacked on one another in the same manner as in Example 1, and disposed between one-side roughened electrolytic copper foils each having a thickness of 18 μm, followed by heat pressure molding at 185° C. at a pressure of 4 MPa for 60 minutes, thus preparing a laminate, but most of the resin flowed away as uncured during heating and pressing, so that a laminate having a desired sheet thickness could not be prepared.

Comparative Example 2

The varnish prepared in Comparative example 1 was dried at 170° C. for 20 minutes to obtain a prepreg, and then, a laminate was prepared in the same manner as in Example 1. Precipitation of white dicyandiamide crystals was observed on the entire surface of the prepreg, but a laminate having a desired sheet thickness could be prepared. However, when the copper foil of the prepared laminate was removed by chemical etching, separation in a scale form between aluminum hydroxide and the resin was observed on the entire surface of the laminate. The formulation, the rate of the change in gel time, and the properties of the laminate are shown in Table 1.

Comparative Example 3

A varnish for laminate and prepreg was prepared in the same manner as in Example 1. First, epoxy resin A, dicyandiamide, curing promoter A, and 2-methoxyethanol were mixed together and reacted at 65° C. for 20 hours, and then, other ingredients were added thereto at room temperature. A glass cloth (weight: 105 g/m$^2$) was impregnated with the resultant varnish, and dried at 160° C. for 10 minutes to obtain a prepreg. Precipitation of white dicyandiamide crystals was observed on the entire surface of the prepreg. A laminate was prepared in the same manner as in Comparative example 1. When the copper foil of the prepared laminate was removed by chemical etching, separation in a scale form between aluminum hydroxide and the resin was observed on the entire surface of the laminate. The formulation, the rate of the change in gel time, and the properties of the laminate are shown in Table 1.

Comparative Example 4

A varnish for laminate and prepreg was prepared in substantially the same manner as in Example 1 except that the amount of curing promoter A was changed. A glass cloth (weight: 105 g/m$^2$) was impregnated with the prepared varnish, and dried at 160° C. for 3 minutes to obtain a prepreg, and the prepreg was subjected to heat-press in the same manner as in Example 1 to prepare a laminate. Precipitation of dicyandiamide was not observed on the prepreg, but the flowability of the prepreg was considerably lowered and satisfactory melt flow did not occur in the resin during the molding, whereby causing molding failure at the end portion of the prepreg. The formulation, the rate of the change in gel time, and the properties of the laminate are shown in Table 1.

The preparation of a prepreg under heating conditions such that the drying time was 3 minutes or shorter was impossible because the solvent was not volatilized satisfactorily.

TABLE 1

(unit: part(s) by weight)

| | | Example 1 | Example 2 | Example 3 | Example 4 | Example 5 | Comparative example 1 | Comp. ex. 2 | Comp. ex. 3 | Comp. ex. 4 |
|---|---|---|---|---|---|---|---|---|---|---|
| Formulation | Epoxy resin A | 100 | 100 | | 100 | 100 | 100 | 100 | 100 | 100 |
| | Epoxy resin B | | | 100 | | | | | | |
| | Dicyandiamide | 4.5 | 4.5 | 5.3 | 4.5 | 4.5 | 4.5 | 4.5 | 4.5 | 4.5 |
| | Curing promoter A | 0.006 | | 0.006 | 0.006 | 0.006 | 0.006 | 0.006 | 0.006 | 0.300 |
| | Curing promoter B | | 0.005 | | | | | | | |
| | Organic flame retardant A | 15 | 15 | 15 | | 15 | 15 | 15 | 15 | 15 |
| | Organic flame retardant B | | | | 17 | | | | | |
| | Aluminum hydroxide | 65 | 65 | 65 | 65 | | 65 | 65 | 65 | 65 |
| | Magnesium hydroxide | | | | | 55 | | | | |
| | 2-Methoxyethanol | 55 | 55 | 55 | 55 | 55 | 55 | 55 | 55 | 55 |
| | Methyl ethyl ketone | 45 | 45 | 45 | 45 | 40 | 45 | 45 | 45 | 45 |
| Characteristics | Varnish gel time (sec) | 480 | 475 | 423 | 482 | 491 | 682 | 682 | 624 | 199 |
| | Retention ratio of varnish gel time (%; 25° C., 2 weeks) | 85 | 84 | 87 | 85 | 80 | 85 | 85 | 82 | 32 |
| | Laminate appearance (after etching for copper foil) | Excellent | Excellent | Excellent | Excellent | Excellent | Thin spot on the entire surface | Scale-form unevenness | Scale-form unevenness | Excellent |
| | Flame retardancy [average burning time (sec)/rating] | 1.7 V-0 | 2.1 V-0 | 1.5 V-0 | 2.3 V-0 | 2.2 V-0 | 2.3 V-0 | 3.5 V-0 | 4.2 V-0 | 3.2 V-0 |
| | Resistance to soldering heat (260° C.) | ○ | ○ | ○ | ○ | ○ | ○ | X | ○ | ○ |
| | Resistance to soldering heat (288° C.) | ○ | ○ | ○ | ○ | ○ | X | X | X | ○ |

From the results in Table 1, in all the Examples as exemplified, the separation in a scale form between the resin and the filler, which occurred when a varnish was prepared by simply mixing raw materials at room temperature, was suppressed, and a uniform laminate was obtained. Further, with respect to the resistance to soldering heat, it has been confirmed that blistering is suppressed and the reliability as a laminate is improved. On the other hand, in each of Comparative examples 1 and 2, in which a reaction for enhancing the compatibility was not conducted, and Comparative example 3 in which a reaction for enhancing the compatibility was conducted under conditions that are not those specified in the present invention, separation between the resin and the filler occurred during the molding, so that a uniform laminate could not be prepared. In addition, in Comparative example 4 in which the curing promoter was added in an amount which fell outside the range specified in the present invention, not only could an appropriate curing property not be secured, but also the storage stability of the varnish was unsatisfactory. From these results, the effectiveness and advantage of the present invention are apparent.

Examples 6 to 10

On the surface of the double-sided copper-clad laminate obtained in each of Examples 1 to 5, a circuit (a test pattern) was formed by a subtractive process. Further, the surfaces of the resultant two double-sided copper-clad laminates having circuits were roughened to improve the adhesion of the surfaces, and the two prepregs obtained in each Example were together disposed between the above-roughened laminates, and the resultant laminate was disposed between further two prepregs and then the both surfaces were covered with 18 μm one-side roughened electrolytic copper foils, and subjected to laminating press in the same manner as in Example 1, thus preparing a 6-layer printed wiring board. The prepared printed wiring board was subjected to exterior circuit processing, through hole formation, resist ink printing, and parts mounting by a general method. It has been confirmed that the printed wiring board can be processed by an ordinary production process for a general printed wiring board without a problem, and that the resultant printed wiring board meets the quality and reliability required for the glass epoxy laminate provided in JIS C 6484 and 6486.

UTILIZABILITY IN INDUSTRY

According to the present invention, a varnish for a laminate or a prepreg in which an epoxy resin and dicyandiamide have good compatibility, causes no separation between the resin and the filler and have good storage stability simultaneously, a flame-retardant laminate or prepreg for electrical insulation using the varnish in which it is uniform and prevented from occurrence of blister and has excellent heat resistance and high reliability, and a printed wiring board using the laminate or the prepreg can be provided.

What is claimed is:

1. A varnish for laminate or prepreg, said varnish comprising: an epoxy resin as component (a); dicyandiamide as component (b); a compound having an imidazole ring as component (c), said compound being present in an amount of 0.001 to 0.03% by weight, based on the weight of component (a); and an inorganic filler as component (d);
   wherein said varnish is produced by a process comprising the steps of: (1) forming a mixture of components (a), (b), and (c), wherein component (c) is present in an amount of 0.001 to 0.03% by weight, based on the weight of component (a); (2) forming a solution by dissolving said mixture in a solvent; (3) heating said solution to a temperature of 70° C. to less than 140° C., thereby causing pre-reaction of components (a) and (b); and (4) adding component (d);

wherein the pre-reaction product of components (a) and (b) enhances compatibility between components (a) and (b), yielding a varnish in which: components (a), (b), and (c) are all compatible with each other in the absence of a solvent; and component (d) remains uniformly dispersed therein.

2. The varnish for laminate or prepreg according to claim 1, wherein the component (a) has a structure represented by the following formula (1):

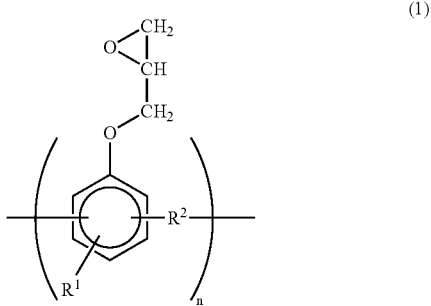

wherein each of $R^1$ represents a hydrogen atom or an optional monovalent organic group, $R^2$ represents an optional divalent organic group, and n is an integer of 2 or more.

3. The varnish for laminate or prepreg according to claim 2, wherein the component (a) is one or two kinds of epoxy resin selected from the group consisting of a phenolic novolak-type epoxy resin and an ortho-cresol novolak-type epoxy resin.

4. The varnish for laminate or prepreg according to claim 2, wherein n is an integer of 2 to 6.

5. The varnish for laminate or prepreg according to claim 1, wherein the component (d) is at least one inorganic filler selected from the group consisting of aluminum hydroxide, magnesium hydroxide, silica, mica, talc, aluminum oxide, magnesium carbonate, barium carbonate, calcium carbonate, and titanium oxide.

6. The varnish for laminate or prepreg according to claim 5, wherein the pre-reaction is conducted in at least one organic solvent selected from the group consisting of methyl ethyl ketone, methyl isobutyl ketone, ethylene glycol, diethylene glycol, 2- methoxyethanol, 2-(2-methoxyethyl)ethanol, 2-ethoxyethanol, 2-(2-ethoxyethyl)ethanol, N,N-dimethylformamide, N,N-dimethylacetamide, N-methyl-2-pyrrolidone, and cyclohexanone.

7. The varnish for laminate or prepreg according to claim 6, wherein the ratio of the weight of component (b) to the epoxy equivalent of component (a) is 7.35 to 11.55, in terms of [weight (g) of (b)]/{[weight (g) of (a)]/epoxy equivalent}.

8. The varnish according to claim 7, wherein the four components (a), (b), (c), and (d) and the other components added do not contain chlorine and bromine in respective amounts of 0.1% by weight or more, based on the weight of the varnish.

9. A laminate or prepreg comprising the varnish according to claim 7.

10. The laminate or prepreg according to claim 9, wherein the four components (a), (b), (c), and (d) and other components added do not contain chlorine and bromine in respective amounts of 0.1% by weight or more, based on the weight of the laminate or prepreg.

11. A printed wiring board comprising at least one of the laminate and the prepreg according to claim 9.

12. The printed wiring board according to claim 11, wherein the four components (a), (b), (c), and (d) and other components added do not contain chlorine and bromine in respective amounts of 0.1% by weight or more, based on the weight of the printed wiring board.

13. The varnish for laminate or prepreg according to claim 1, wherein the component (a) is one or two kinds of epoxy resin selected from the group consisting of a phenolic novolak-type epoxy resin and an ortho-cresol novolak-type epoxy resin.

14. The varnish for laminate or prepreg according to claim 1, wherein the pre-reaction is conducted in at least one organic solvent selected from the group consisting of methyl ethyl ketone, methyl isobutyl ketone, ethylene glycol, diethylene glycol, 2-methoxyethanol, 2-(2-methoxyethyl)ethanol, 2-ethoxyethanol, 2-(2-ethoxyethyl)ethanol, N,N-dimethylformamide, N,N-dimethylacetamide, N-methyl-2-pyrrolidone, and cyclohexanone.

15. The varnish for laminate or prepreg according to claim 1, wherein the ratio of the weight of component (b) to the epoxy equivalent of component (a) is 7.35 to 11.55, in terms of [weight (g) of (b)]/{[weight (g) of (a)]/epoxy equivalent}.

16. A laminate or prepreg comprising the varnish according to claim 1.

17. A printed wiring board comprising at least one of the laminate and the prepreg according to claim 16.

18. The printed wiring board according to claim 17, wherein the four components (a), (b), (c), and (d) and other components added do not contain chlorine and bromine in respective amounts of 0.1% by weight or more, based on the weight of the printed wiring board.

19. The laminate or prepreg according to claim 16, wherein the four components (a), (b), (c), and (d) and other components added do not contain chlorine and bromine in respective amounts of 0.1% by weight or more, based on the weight of the laminate or prepreg.

20. The varnish according to claim 1, wherein the four components (a), (b), (c), and (d) and the other components added do not contain chlorine and bromine in respective amounts of 0.1% by weight or more, based on the weight of the varnish.

21. The varnish for laminate or prepreg according to claim 1, wherein said compound having an imidazole ring is selected from the group consisting of imidazole, 2-and/or4- and/or5-substituted imidazoles, N-substituted imidazoles, a reaction product of imidazole and a glycidyl compound, a reaction product of imidazole and a diglycidyl compound, and a reaction product of 2-ethyl-4-methylimidazole and a diglycidyl compound.

22. The varnish for laminate or prepreg according to claim 1, wherein the process of producing said varnish comprises the step of: (3) heating said solution to a temperature of 70° C. to less than 140° C., thereby causing pre-reaction of components (a) and (b).

23. A process of preparing a varnish for laminate or prepreg, said process comprising the steps of: (1) forming a mixture of: an epoxy resin as component (a), dicyandiamide as component (b), and a compound having an imidazole ring as component (c), wherein component (c) is present in an amount of 0.001 to 0.03% by weight, based on the weight of component (a); (2) forming a solution by dissolving said mixture in a solvent; (3) heating said solution to a temperature of 70° C. to less than 140° C., thereby causing pre-reaction of components (a) and (b); and (4) adding component (d);

wherein the pre-reaction product of components (a) and (b) enhances compatibility between components (a) and (b), yielding a varnish in which: components (a), (b), and (c) are all compatible with each other in the absence of a solvent; and component (d) remains uniformly dispersed therein.

* * * * *